United States Patent [19]
Suzuki et al.

[11] Patent Number: 5,218,567
[45] Date of Patent: Jun. 8, 1993

[54] MATCH DETECTION CIRCUIT FOR CACHE MEMORY APPARATUS

[75] Inventors: Makoto Suzuki, Niiza; Suguru Tachibana, Hachioji; Hisayuki Higuchi, Kokubunji, all of Japan

[73] Assignee: Hitachi, Ltd., Tokyo, Japan

[21] Appl. No.: 789,003

[22] Filed: Nov. 7, 1991

Related U.S. Application Data

[63] Continuation-in-part of Ser. No. 580,464, Sep. 11, 1990.

[30] Foreign Application Priority Data

| Sep. 14, 1989 | [JP] | Japan | 1-237044 |
| Jan. 19, 1990 | [JP] | Japan | 2-008253 |
| Nov. 9, 1990 | [JP] | Japan | 2-302410 |

[51] Int. Cl.$^5$ ............................................. G11C 11/34
[52] U.S. Cl. ................................. 365/177; 365/179
[58] Field of Search ................... 365/177, 179; 357/43

[56] References Cited

U.S. PATENT DOCUMENTS

| 4,335,449 | 6/1982 | Nokubo | 365/177 |
| 4,829,479 | 5/1989 | Mitsumoto et al. | 365/177 |
| 4,866,673 | 9/1989 | Higuchi et al. | 365/177 |
| 4,942,555 | 7/1990 | Higuchi et al. | 365/177 |

*Primary Examiner*—Eugene R. LaRoche
*Assistant Examiner*—Michael C. Kessell
*Attorney, Agent, or Firm*—Antonelli, Terry, Stout & Kraus

[57] ABSTRACT

A cache memory apparatus made up of a memory cell array (300) and a match detection circuit is disclosed. The match detection circuit produces a detection signal related to whether a search data coincides with a data read out of the memory cell array (300). The match detection circuit applies complementary signals (d, $\bar{d}$) of the data read from the memory cell array (300) to the bases of bipolar differential transistors (10, 11), the gates of a pair of field effect transistors (16, 17) are supplied with complementary signals (a, $\bar{a}$) of the search data, and the bases of a pair of emitter-follower transistors (12, 13) are connected to the collectors of the bipolar differential transistors (10, 11), thereby producing a detection signal ($\overline{\text{HITO}}$) from the jointly-connected emitters thereof.

2 Claims, 5 Drawing Sheets

| d | a | $c_1$ | $c_2$ | $c_1 + c_2$ |
|---|---|---|---|---|
| L | L | L | L | L |
| L | H | H | L | H |
| H | L | L | H | H |
| H | H | L | L | L |

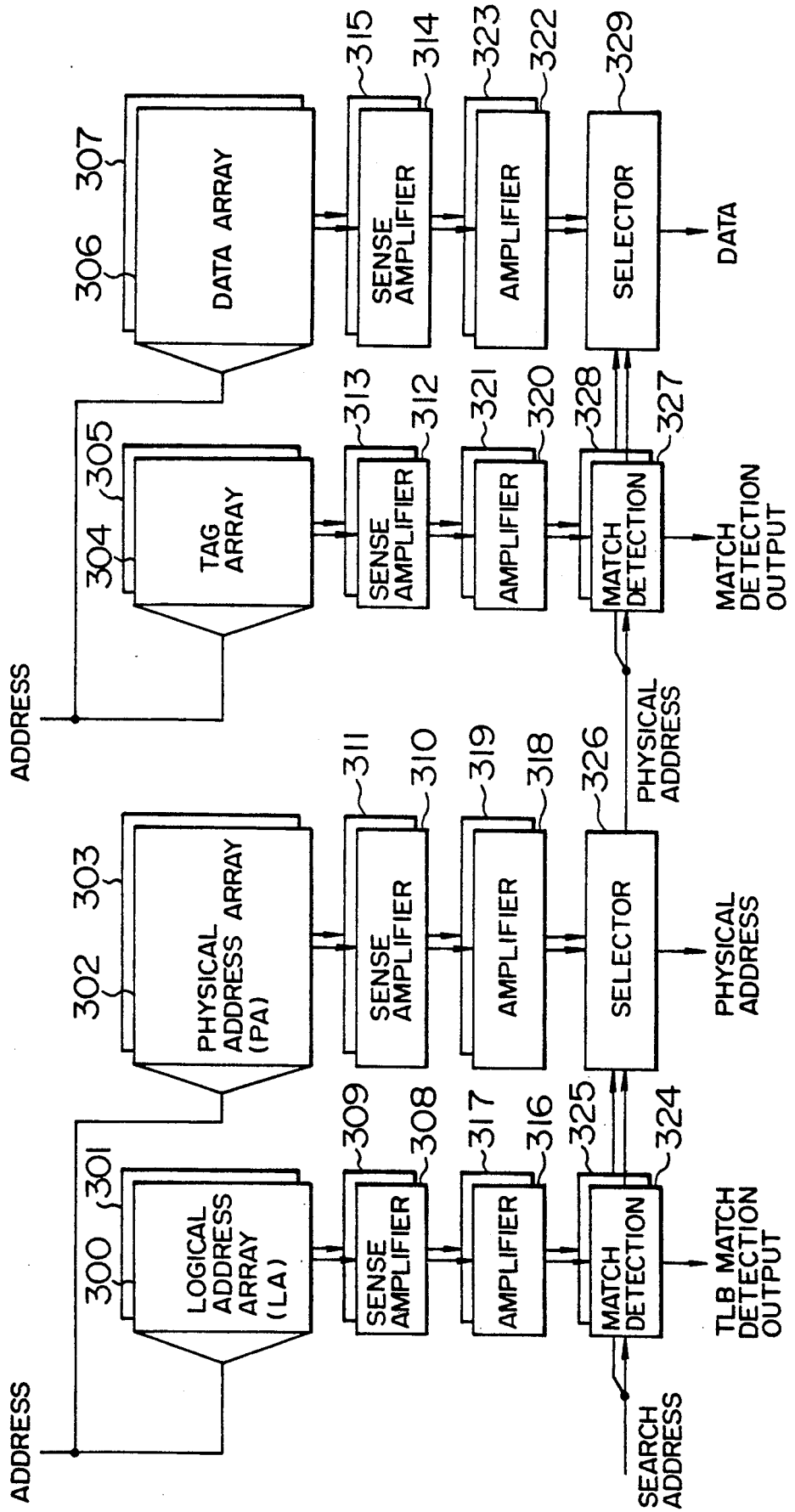

MATCH DETECTION CIRCUIT FOR CACHE MEMORY APPARATUS

CROSS-REFERRENCE TO THE RELATED APPLICATION

The present application is a continuation-in part of copending application U.S. Ser. No. 07/580,464 filed Sep. 11, 1990 pending Nov. 23, 1992 entitled "SEMICONDUCTOR MEMORY DEVICE" by Makoto SUZUKI et al. and assigned to the present assignee, the disclosure of which is incorporated by reference.

BACKGROUND OF THE INVENTION

The present invention relates to a memory apparatus used for a microprocessor or the like.

In a mainframe computer or other computer systems including a microprocessor, a cache memory apparatus is used for holding a part of the contents of a main memory between a central processing unit and the main memory to improve the operating speed.

The cache memory apparatus finds various applications. Some of them include the data cache or the instruction cache. These cache memory apparatuses may be configured of what is called a CAM (Content Addressable Memory). In the CAM, it is decided whether a search address is matched with an address stored in a first memory cell array (tag array), and if matching, a separate second memory cell array (data array) is accessed thereby to read the data or instruction at high speed.

Another application is an address translation cache for supporting a virtual memory system which is a cache memory apparatus generally called TLB (Translation Lookaside Buffer). This TLB is supplied with a logical address of data required by the central processing unit or the like as a search address, and matching with the content of the first memory cell array (LA) already holding the logical address is detected. It is also decided whether there is a physical address corresponding to the second memory cell array (PA) holding a physical address. If they match with each other, the result (what is called hit information) of decision and a corresponding physical address are produced as an output.

As described above, a cache memory apparatus requires the function of detecting the match between search data and data stored in a first memory cell and the function as a selector for producing the corresponding data stored in a second memory cell array on the basis of a match signal.

A well-known means for realizing the selector function and the function of match detection includes a match detection circuit and a selector circuit disclosed in Nikkei Micro-devices, Apr. 1987, pp. 75 to 90 (hereinafter referred to as "the first prior art") and The Transaction of the Institute of Electronics, Information and Communications in Japan 88/10, Vol. J71-C No. 10, pp. 1442-1449 (hereinafter referred to as "the second prior art").

SUMMARY OF THE INVENTION

In a circuit system according to the first prior art described above, it is necessary to amplify read data of a minute signal level produced on a data line from a memory cell array at a CMOS sense amplifier and apply an amplifier signal to a match detection circuit (comparator). In this way, the amplification required from a minute signal level to a CMOS level signal as an input signal to the match detection circuit causes a delay, thereby posing the problem of the operating speed.

The circuit system according to the second prior art, on the other hand, is capable of supplying read data of a minute signal level produced on a data line from a memory cell array to a match detection circuit (comparator) without amplification and thus capable of detecting a matching with the search data. In spite of the resulting apparent possibility of high speed operation, the operating speed is still insufficient as described below.

Specifically, in the circuit system according to the second prior at, the read data of a minute signal level produced on the data line from the memory cell array is applied to the two bases of bipolar differential transistors through an EOR (exclusive OR) gate configured of four switching MOS transistors without being amplified by any sense amplifier.

It was discovered by the inventors that in order to improve the operating speed, however, the device size of the four switching MOS transistors connected to the two bases of the bipolar differential transistors are required to be increased so that the resistance in the ON state of the four switching MOS transistors may be sufficiently small, thereby posing the problem of integration density.

On the other hand, it was made apparent that for the purpose of producing a match detection output, it is necessary to connect a plurality of collectors of bipolar differential transistors in the form of a wired OR, and therefore a large capacity is generated, thereby similarly posing the problem of the operating speed.

Accordingly, the object of the present invention is to provide a high-integration and high-speed cache memory apparatus solving the above-mentioned problems of the prior art.

There is provided according to the representative aspect of the present invention a cache memory apparatus comprising a memory cell array 300 and a match detection circuit for producing a detection signal relating to the decision whether search data matches with read data from the memory cell array, wherein the match detection circuit includes bipolar differential transistors 10, 11 having the base thereof supplied with complementary signals d, $\bar{d}$ respectively for read data from the memory cell array 300 and having the emitters thereof connected to a current source 18, a pair of field effect transistors 16, 17 having the gates thereof supplied with complementary signals a, $\bar{a}$ of the search data and having the drains thereof connected to the collectors of the bipolar differential transistors 10, 11 respectively, and a pair of emitter-follower transistors 12, 13 having the bases thereof connected to the collector of the bipolar differential transistors 10, 11 respectively and having the emitters connected in common for producing the detection signal.

According to this configuration, the detection signal is capable of being produced as an output from the emitters connected in common of the pair of emitter-follower transistors 12, 13 by a combination of a weak ON or OFF of the bipolar differential transistors 10, 11 responding to the complementary data signals d, $\bar{d}$ of minute amplitude read out from the memory cell array 300 and of ON or OFF of a pair of field effect transistors 16, 17 as active loads responding to the complementary signals of search data. (FIG. 1)

The above and other objects, features and advantages will be made apparent by the detailed description of embodiments taken in conjunction with the accompanying drawings.

BRIEF DESCRIPTION OF THE DRAWINGS

FIG. 2 is a block diagram showing an example of the present patent application by the inventors.

DESCRIPTION OF THE PREFERRED EMBODIMENTS

An embodiment of the present invention will be described below.

Figure 3:
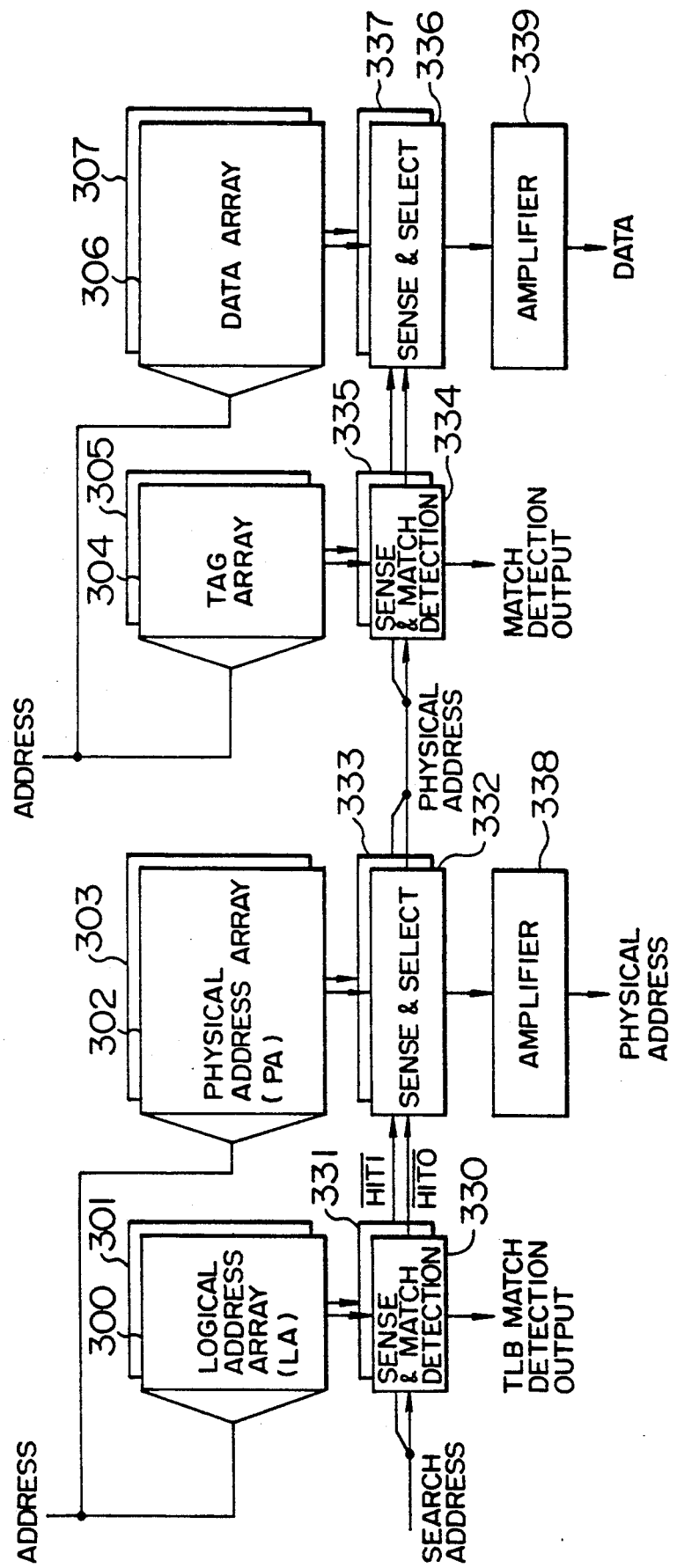
FIG. 3 is a block diagram showing a cache memory apparatus according to an embodiment of the present invention.

First, the configuration and operation of a cache memory apparatus according to the present invention shown in FIG. 3 will be compared with that of the cache memory apparatus studied before the patent application by the inventors by way of explanation.

FIGS. 2 and 3 are block diagrams showing apparatuses in two-way set-associative configuration for both TLB and data cache memory for simplicity's sake as an example of the cache memory apparatus.

In the cache memory apparatus shown in FIG. 2 studied before the present patent application by the inventors, a logical address array 300 and a physical address array 302 make up a way 0 of TLB; a logical address array 301 and a physical address array 303 a way 1 of TLB; a tag array 304 and a data array 306 a way 0 of the cache memory; and a tag array 305 and a data array 307 a way 1 of the cache memory, thus configuring a two-way set-associative cache memory apparatus as a whole.

In accordance with these two ways, the data read out of the memory arrays 300 to 307 are amplified to a signal of desired amplitude by sense amplifiers 308 to 315 and further by amplifiers 316 to 323, and are applied to match detection circuits 324, 325, 327, 328 and selector circuits 326, 329. The match detection circuits 324, 325 detect a matching between a search address and an address read out of the logical address arrays 300, 301. When these two addresses match each other, the selector circuit 326 selects and produces the physical address of one of the two ways read from the physical address arrays 302, 303. This physical address is applied to the match detection circuits 327, 328 to detect a matching thereof with the physical address read out of the tag arrays 304, 305. When they match each other, the selector circuit 329 selects and produces the data of one of the two ways read from the data arrays 306, 307.

As a result of the operation described above, the cache memory apparatus shown in FIG. 2 detects a matching between the contents of a logical address array and a search address, according to which a way of the physical address array is selected. Further, the apparatus detects a matching between the contents of a tag array and the physical address converted by TLB, and on the basis of this result, selects a way of the data array as a cache memory.

In the cache memory apparatus shown in FIG. 2, the match detection circuit and the selector circuit are comprised of an ordinary CMOS circuit supplied with a CMOS level signal. The data of minute amplitude read out of the memory cell array, therefore, is supplied to a match detection circuit and a selector circuit only after being amplified to CMOS level by sense amplifiers and amplifiers In the cache memory apparatus according to an embodiment of the present invention in FIG. 3, in contrasts, uses differential amplifier circuits 330, 331, 334, 335 having integratedly combined functions of match detection and sense amplification, and differential amplifier circuits 332, 333, 336, 337 having integratedly combined functions of selection and sense amplification.

In the cache memory apparatus according to an embodiment of the present invention shown in FIG. 3, therefore, it is possible to configure a path for application of a search address, match detection of TLB, way selection, match detection of a cache memory and way selection without any amplifier having the exclusive function of amplifying the signal to CMOS level thereby increasing the operating speed of a cache memory apparatus. Also, the power consumption of a cache memory apparatus is reduced by saving power which otherwise might be required for signal amplification from minute amplitude to CMOS level.

The amplifier 338 in the embodiment of FIG. 3 is for amplifying the physical address required for collecting data from other memory units such as a main memory in case of cache miss and has no effect on the operating speed of the path.

Now, the apparatus according to the invention shown in the block diagram of FIG. 3 will be described in detail below with reference to the circuits of the embodiment shown in FIGS. 1 and 4.

Figures 1, 1A:
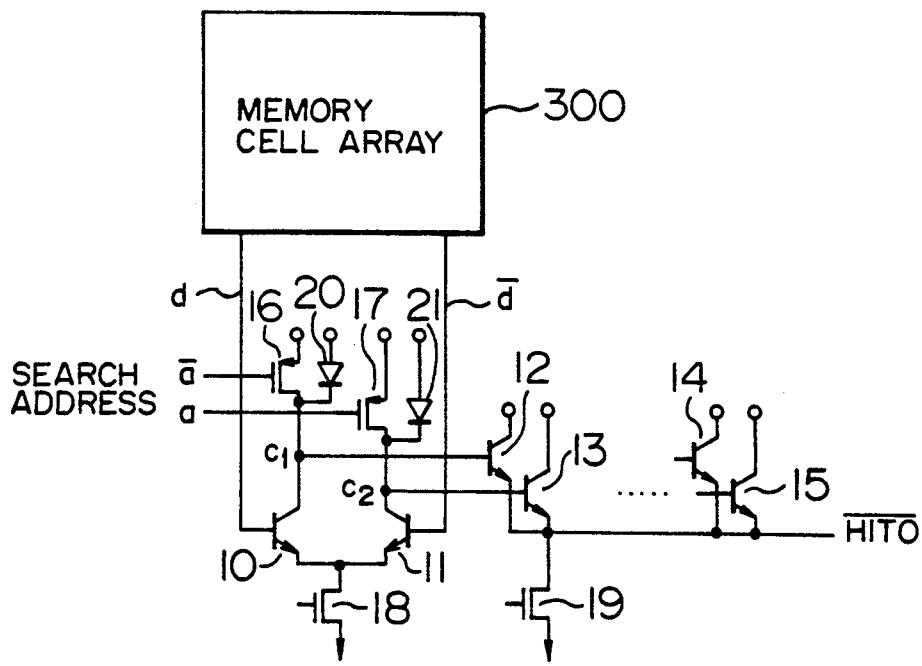
FIG. 1 is a diagram showing a logic circuit making up a match detection circuit in a cache memory apparatus according to an embodiment of the present invention.
FIG. 1A is a table showing signal levels.

FIG. 1 is a circuit diagram showing an embodiment of preferred differential amplifier circuits 330, 331, 334, 335 having integratedly combined functions of match detection and sense amplification in a cache memory apparatus according to the embodiment shown in FIG. 3. FIG. 1A is a table showing signal levels.

In FIG. 1, the data of minute amplitude read out of a data line of the memory cell array 300 or common data lines d, $\bar{d}$ are amplified in sense by a differential amplifier circuit including bipolar differential transistors 10, 11 and an n-channel MOS transistor (hereinafter referred to as "NMOS") 18 providing a current source.

The p-channel MOS transistors (hereinafter referred to as "PMOS") 16, 17 function as load devices for the bipolar differential transistors 10, 11. Also, the resistance values of these transistor are changed by gate input signals of search addresses a, $\bar{a}$ of the PMOSs 16, 17. Further, outputs C1 and C2 of the differential amplifier circuit are subjected to wired OR logic by an emitter-follower circuit including the current source NMOS 19 and the bipolar transistors 12, 13. Thus this differential amplifier circuit also functions as a match detection circuit as described below.

First, explanation will be made about the operation in the case where the read data d of the memory cell array 300 and the search data match each other at high levels (hereinafter indicated as "H level") of both d and a. In the case of a differential amplifier circuit having a normal resistor element, C1 becomes low level (hereinafter referred to as "L level") and C2 an H level. Although the ON state of the bipolar transistor 10 conflicts with the ON state of the PMOS 16, the resistance in the ON state of the bipolar transistor 10 is much lower than that of the PMOS 16. Therefore, C1 becomes L level. Since the differential voltage appearing on the data line pair d, $\bar{d}$ is minute, on the other hand, the bipolar transistor 11 turns weak OFF and a slight amount of current flows. The PMOS 17 turns OFF and poses a high resistance, and therefore C2 also becomes L level.

In the case where d=a=L level, the ON state of the bipolar transistor 11 and that of the PMOS 17 conflict with each other. In view of the fact that the resistance in the ON state of the bipolar transistor 11 is much lower than that of the PMOS 17, however, C2 is reduced to L level. The differential voltage appearing on the data lines d, $\bar{d}$ are so minute that the bipolar transistor 10 turns weak OFF, causing a small current. On the other hand, the PMOS 16 turns off and poses a high resistance, thereby reducing C1 to L level.

Now, the operation under mismatch at H level of d and L level will be explained. In the case of a differential amplifier circuit having an ordinary resistor element, C1 and C2 become L and H levels respectively. In the case of the circuit shown in FIG. 1, the bipolar transistor 10 turns weak ON, and the PMOS 16 OFF posing a high resistance, so that C1 becomes L level. The bipolar transistor 11, on the other hand, turns weak OFF and the PMOS 17 ON presenting a low resistance, and therefore C2 becomes H level.

When d is at L and a at H level, the bipolar transistor 11 turns weak ON and the PMOS 17 OFF posing a high resistance, so that C2 becomes L level. The bipolar transistor 10s, on the other hand, turns weak OFF and the PMOS 16 turns ON, thereby causing C1 to rise to H level.

Diodes 20, 21 are for clamping the potentials of C1 and C2 so as not to decrease extremely. The sources of the PMOSs 16, 17, the collectors of the bipolar transistors 12 to 15 and the anodes of the diodes 20, 21 dare supplied with a source voltage Vcc.

As a result, the H level of C1, C2 provides the source voltage Vcc, so that if the forward voltage across the diodes 20, 21 is VF, the L level of C1, C2 is given as $Vcc - V_F$.

The table in the lower part of FIG. 1 indicates the above-mentioned operations collectively. As seen from the foregoing description of the operation and the table, $C1 = \bar{d} \cdot a$ and $C2 = d \cdot \bar{a}$. Therefore, the wired OR signal $C1 + C2 = \bar{d} \cdot a + d \cdot \bar{a}$ causes an operation as a match detection circuit with an exclusive OR (EXOR) gate. Specifically, in the case where the data d read from the memory cell array matches the search address a, the output $\overline{HITO}$ thereof becomes L level, and rises to H level in the case of mismatch. In FIG. 1, bipolar transistors 14, 15 are similar to the bipolar transistors 12, 13 and operate to produce a match detection signal for other bits. By processing match detection signals for a multiplicity of bits through a wired OR gate, a match detection signal for the whole circuit is obtained.

The circuit according to the embodiment shown in FIG. 1 is thus capable of performing a match detection without amplifying a read signal of minute amplitude from the memory cell array 300 to CMOS level, thereby improving the speed and reducing the power consumption of a cache memory apparatus.

Also, it is possible to integrate a match detection circuit with a sense amplifier circuit for detecting a read signal from the memory cell array, thereby further promoting high speed and low power consumption.

This circuit may alternatively be configured of a series-gate circuit of ECL although a high source voltage is required. As compared with this, the circuit according to the embodiment of FIG. 1 is operable with a low source voltage of, say, 3.3 V.

Further, the collectors C1, C2 of the bipolar differential transistors 10, 11 are connected to the output $\overline{HITO}$ through the base-emitter junctions of the emitter-follower transistors 12, 13, and thus direct connection therebetween is avoided. As a result, in match detection for a multiplicity of bits, a decrease in the operating speed which otherwise might be caused by direct connection of the output $\overline{HITO}$ with the collectors of a multiplicity of bipolar differential transistors is prevented.

In the embodiment shown in FIG. 1, the search address signals a, $\bar{a}$ may of course be signals of CMOS level. The search address (logical address) applied to TLB is supplied from an external unit of the cache memory in a microprocessor.

Figure 4:
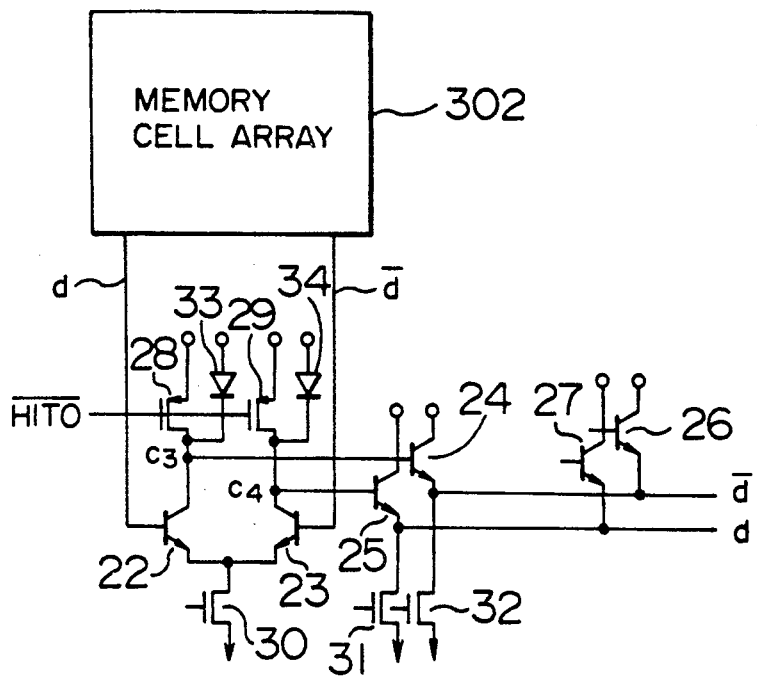
FIG. 4 is a diagram showing a selector circuit in a cache memory apparatus according to an embodiment of the present invention.

FIG. 4 is a diagram showing an embodiment of a preferred circuit as a sense amplifier circuit integratedly combined and doubling as selector circuits 332, 333 or 336, 337.

In FIG. 4, the data of minute amplitude read onto the data lines or common data lines d, $\bar{d}$ from the memory cell array 302 are amplified by a differential amplifier circuit including bipolar transistors 22, 23 and a current source with an NMOS 30. The PMOSs 28, 29 function as load elements for the bipolar differential transistors 22, 23. The gates of the PMOSs 28, 29 are supplied with the output signal $\overline{HITO}$ of FIG. 1, thereby changing the resistance value of the PMOSs 28, 29. Further, the outputs C3, C4 of the differential amplifier circuits are applied to an emitter-follower circuit including bipolar transistors 24, 25 and current sources NMOS 31, 32, which functions as a wired OR gate which produces a logic sum of the outputs C3, C4 and emitter-follower outputs of the bipolar transistors 26, 27 of a similar circuit for another way. Thus the emitter-follower circuit operates as a selector circuit as will be described below.

First, reference is had to the operation in the case of mismatch in the match detection circuit in the first stage of FIG. 1 at H-level $\overline{HITO}$. In the case of a differential amplifier circuit with an ordinary resistor element, either C3 or C4 is at L level and the other at H level. In the case of the circuit of FIG. 4, however, the PMOSs 28, 29 provide high resistances and both C1 and C2 become L level, so that the output of the output circuit made up of a wired OR gate is not affected and therefore no data on a mismatched way is outputted.

Now, the operation will be explained about a case in which the result of detection by the match detection circuit in the first stage of FIG. 1 is matching at $\overline{HITO}$ of L level. In the case of a differential amplifier with a load of an ordinary resistor, either C3 or C4 is at L level, and the other at H level. Also in the case of the circuit shown in FIG. 4 where a load is made up of PMOSs 28, 29, both PMOSs 28 and 29 provide a low resistance. Since the ON resistance of the bipolar transistors is much lower than that of the PMOSs, however, C3 or C4 becomes L and the other H level as in the case of a differential amplifier circuit having an ordinary resistor as a load. As a result, an output circuit including a wired OR gate selects and produces a data of the matched way. The diodes 33, 34 are for clamping the potentials of C3, C4 so as not to drop extremely.

As seen from above, the circuit according to the embodiment shown in FIG. 4 is capable of selecting operation without amplifying the match detection output $\overline{HIT0}$ of the circuit in FIG. 1 to CMOS level, thereby improving the operating speed and saving the power consumption of the cache memory apparatus. Also, the sense amplifier for detecting the read signal from the memory cell array 302 may be integratedly combined with the selector circuit, thereby further improving the operating speed and power consumption. Although a similar circuit may be configured of a series gate circuit of ECL, the latter requires a high source voltage. In contrast, the circuit according to the embodiment of FIG. 4 is operable under a low source voltage of, say, 3.3 V.

The cache memory apparatus according to the embodiment shown in FIG. 3 comprises a match detection circuit shown in FIG. 1 with a differential amplifier circuit with the match detection function 330 for the logical address array 300 making up the way 0 of TLB, and another match detection shown in FIG. 1 as a differential amplifier circuit having the match detection function 331 for the logical address array 301 making up the way 1 of TLB. The match detection output $\overline{HIT0}$ of the differential amplifier circuit 330 and the match detection output $\overline{HIT1}$ of the differential amplifier circuit 331 are applied to the differential amplifier circuits 332 and 333 having the selector function respectively.

When $\overline{HIT0}$ is at level, the physical address read from the physical address array 302 making up the way 0 is applied through the circuit 332 to the differential amplifier circuits 334, 335 with the match detection function. When $\overline{HIT1}$ is at L level, on the other hand, the physical address read out of the physical address array 303 making up the way 1 is supplied through the circuit 333 to the differential amplifier circuits 334, 335 with the match detection function. When one of $\overline{HIT0}$ and $\overline{HIT1}$ is at L level, the match detection output of TLB becomes H level.

Figure 5:
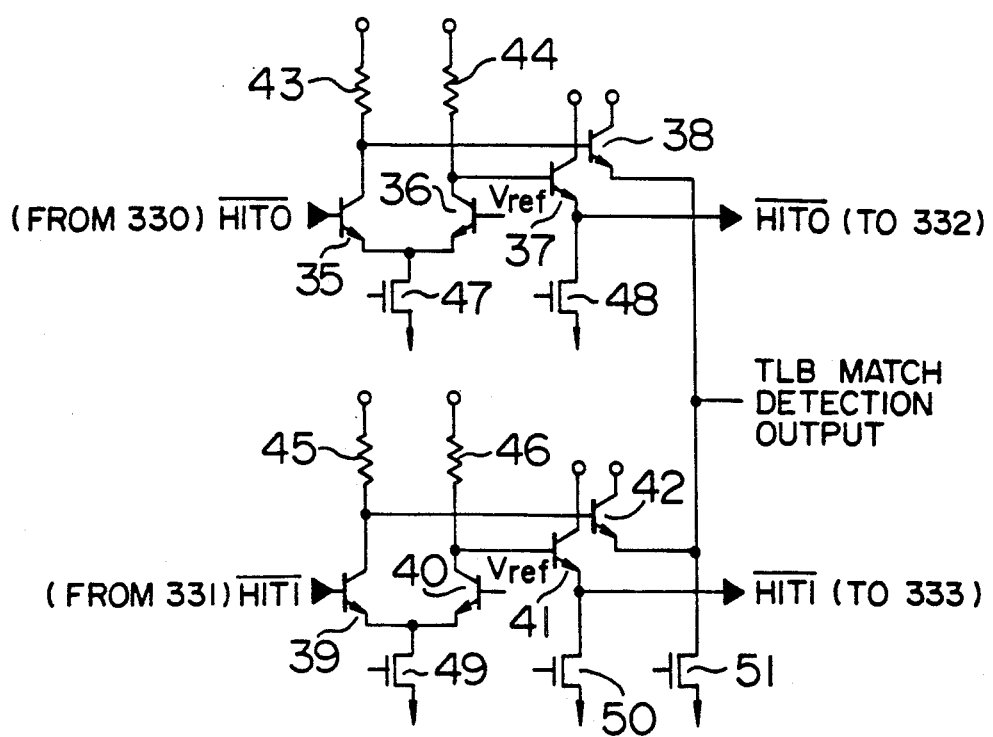
FIG. 5 shows a circuit example for generating a TLB match detection output or the like in FIG. 3.

FIG. 5 is a circuit diagram showing an embodiment of a preferred circuit for generating the match detection output of TLB from the differential amplifier circuits 330, 331 on the one hand and the match detection amplification signals $\overline{HIT0}$ and $\overline{HIT1}$ supplied to the differential amplifier circuits 332, 333 having the selection function in a cache memory apparatus according to the embodiment shown in FIG. 3. The circuit shown in FIG. 5 basically configures an ECL circuit, an emitter-follower circuit for a wired-OR gate.

In the case where either the way 0 or 1 of TLB matches, the TLB match detection signal of the circuit in FIG. 5 becomes H level, while if neither the way 0 or 1 matches, the TLB detection signal falls to L level.

Figure 6:
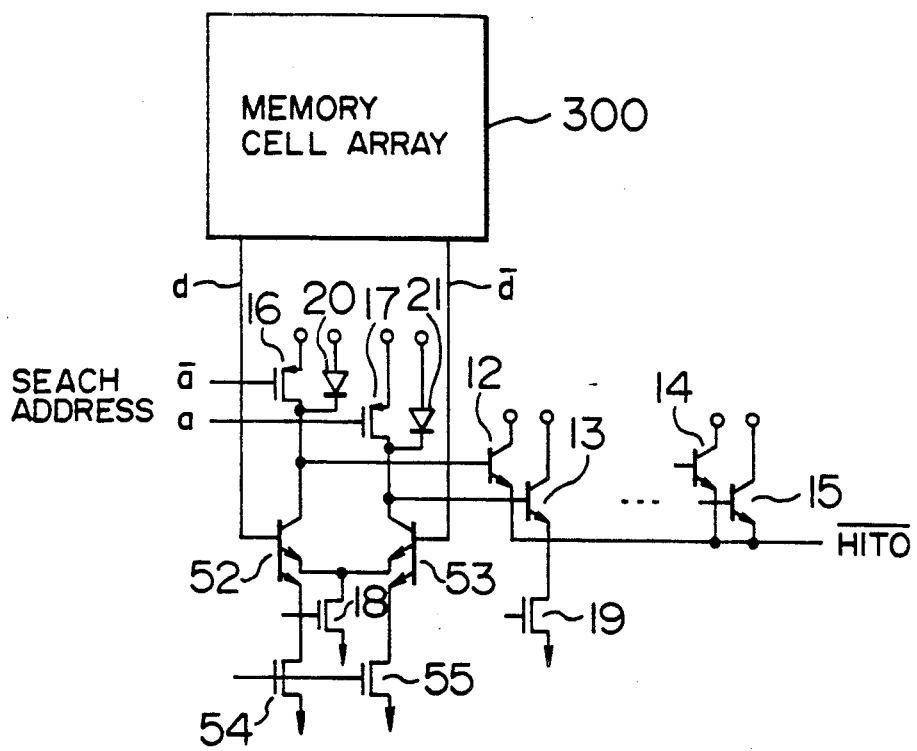
FIG. 6 is a circuit diagram showing a modification including an improvement of the match detection circuit shown in FIG. 1.

FIG. 6 is a circuit diagram showing another modification of a circuit suited for the differential amplifier circuits 330, 331, 334 and 335 having integratedly-combined functions of match detection and sense amplification in a cache memory apparatus.

In the circuit according to the embodiment shown in FIG. 1, as explained above in relation to operation, the two bipolar differential transistors turn weak ON and OFF respectively in response to a data of minute amplitude read out of a memory cell array. As a consequence, the current of a current source of jointly-connected emitters of the bipolar differential transistors is divided delicately between the two bipolar differential transistors, so that the operation of match detection described above is realized by the circuit shown in FIG. 1.

In the circuit according to the embodiment shown in FIG. 6, in contrast, the operation is stabilized by adding a current source with NMOSs 54, 55 using bipolar transistors 52, 53 of multi-emitter type. More specifically, even when the shunt ratio of the bipolar differential transistors undergoes a change by process variations or the like, a current is supplied in such a manner as to stabilize the circuit. In other words, the circuit according to the embodiment of FIG. 6 uses bipolar transistors 52, 53 of multi-emitter type in place of the bipolar transistors 10, 11 employed in the embodiment of FIG. 1.

As a result, in view of a small current flowing in the current sources NMOSs 54, 55 connected to the second emitters of the bipolar transistors 52, 53 of multi-emitter type, a slight amount of current continues to flow to terminals C1, C2 even when the current of the first emitter of one of the bipolar transistors of multi-emitter type connected to the current source 18 becomes zero.

The present invention is not limited to the embodiments specifically described above, but may be modified in various ways without departing from the spirit of the invention.

In FIG. 1, for example, the npn-type bipolar differential transistors 10, 11 may be replaced by pnp-type bipolar differential transistors with equal effect, in which case the PMOSs 16, 17 are replaced by NMOSs.

Further, the diodes 20, 21 for clamping the L level of the terminals C1, C2 may be replaced by clamp circuits made up of transistors.

It will thus be understood from the foregoing description that according to the present invention, there is provided a high-integrity, high-speed cache memory apparatus.

We claim:

1. A cache memory apparatus comprising:
   a memory cell array; and
   a match detection circuit for producing a detection signal related to the judgement as to whether search data matches data read out of the memory cell array,
   wherein the match detection circuit includes:
   bipolar differential transistors in which the bases thereof are supplied with complementary signals of the data read out of the memory cell array and in which each has an emitter thereof connected to a first current source,
   a pair of field effect transistors in which the gates thereof are supplied with a complementary signal of the search data and the drains thereof are connected to the collectors of the bipolar differential transistors, respectively, and
   a pair of emitter-follower transistors in which the bases thereof are connected to the collectors of the bipolar differential transistors, respectively, and in which emitters thereof are jointly-connected for providing a detection output signal.

2. A cache memory apparatus according to claim 1, wherein each of the bipolar differential transistors is a multi-emitter type transistor having at least first and second emitters, the first emitters of the bipolar differential transistors of multi-emitter type are jointly connected to the first current source, and the second emitters of the bipolar differential transistor are connected to second and third current sources respectively.

* * * * *